United States Patent
Chen et al.

(10) Patent No.: US 10,349,542 B2
(45) Date of Patent: Jul. 9, 2019

(54) SYSTEM AND METHOD FOR A SOLID STATE DRIVE (SSD) ENCLOSURE

(71) Applicant: QUANTA COMPUTER INC., Taoyuan (TW)

(72) Inventors: Chao-Jung Chen, Taoyuan (TW); Chih-Hsiang Lee, Taoyuan (TW); Kun-Pei Liu, Taoyuan (TW); Tsung-Cheng Lin, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/730,944

(22) Filed: Oct. 12, 2017

(65) Prior Publication Data

US 2019/0059167 A1     Feb. 21, 2019

Related U.S. Application Data

(60) Provisional application No. 62/545,815, filed on Aug. 15, 2017.

(51) Int. Cl.
*H05K 5/00* (2006.01)
*H05K 5/02* (2006.01)
*H05K 5/03* (2006.01)

(52) U.S. Cl.
CPC ......... *H05K 5/0221* (2013.01); *H05K 5/0013* (2013.01); *H05K 5/0069* (2013.01); *H05K 5/0256* (2013.01); *H05K 5/03* (2013.01)

(58) Field of Classification Search
CPC ...... H05K 5/0221; H05K 5/03; H05K 5/0256; H05K 5/0013; H05K 5/0069

(Continued)

(56) References Cited

U.S. PATENT DOCUMENTS 6,179,642 B1 *  1/2001  Hwang ............. H01R 13/5804
                                                    439/358
6,191,950 B1 *  2/2001  Cox .................... H05K 5/0269
                                                    174/363

(Continued)

FOREIGN PATENT DOCUMENTS

WO       2016018326 A1     2/2016

OTHER PUBLICATIONS

Extended European Search Report for EP Application No. 18151602.2, dated Jul. 10, 2018.

*Primary Examiner* — Rockshana D Chowdhury
(74) *Attorney, Agent, or Firm* — Nixon Peabody LLP; Zhou Lu

(57) ABSTRACT

The present disclosure provides a latch assembly for securing an electronic component within a computing device. The latch assembly includes a latch, a base, and a cover. The latch includes a first structural member with a first plurality of pins; a second structural member with a second plurality of pins; at least one linking element that connects the first structural member with the second structural member; and a first securing element located at the first structural member. The base includes a receiving space for receiving the latch; a first plurality of slots configured to receive the first plurality of pins; a second plurality of slots configured to receive the second plurality of pins; a plurality of protruding elements; and a second securing element corresponding with the first securing element. The cover is secured to the base at the plurality of protruding elements.

16 Claims, 6 Drawing Sheets

(58) Field of Classification Search
USPC ............. 361/679.34, 679.31, 679.33, 679.01
See application file for complete search history.

(56) References Cited

U.S. PATENT DOCUMENTS

| | | | | |
|---|---|---|---|---|
| 6,351,379 | B1 * | 2/2002 | Cheng | G11B 33/128 |
| | | | | 312/332.1 |
| 6,606,241 | B2 * | 8/2003 | Moore | G06F 1/1616 |
| | | | | 292/19 |
| 7,453,691 | B2 * | 11/2008 | Zhao | G06F 1/187 |
| | | | | 180/338 |
| 7,679,896 | B2 * | 3/2010 | Deng | G06F 1/187 |
| | | | | 312/223.1 |
| 7,916,500 | B2 * | 3/2011 | Shi | H05K 9/0032 |
| | | | | 174/350 |
| 8,218,310 | B2 * | 7/2012 | Ou | G11B 33/124 |
| | | | | 312/223.2 |
| 2008/0089021 | A1 * | 4/2008 | Deng | G06F 1/187 |
| | | | | 361/679.39 |
| 2015/0355686 | A1 | 12/2015 | Heyd et al. | |
| 2016/0100494 | A1 * | 4/2016 | Novysedlak | H05K 1/0212 |
| | | | | 361/748 |
| 2016/0165738 | A1 | 6/2016 | Zhu | |

\* cited by examiner

SYSTEM AND METHOD FOR A SOLID STATE DRIVE (SSD) ENCLOSURE

CROSS REFERENCE TO RELATED APPLICATIONS

This application claims priority to U.S. Provisional Application No. 62/545,815 entitled "M.2 LOW PROFILE FLASH CARD AUTO-LOCK/RELEASE FIX MECHANISM", filed on Aug. 15, 2017, the contents of which are expressly incorporated by reference in its entirety.

FIELD OF THE INVENTION

The disclosure relates generally to a latch assembly configured to secure a solid state drive (SSD) device within a computing system.

BACKGROUND

A solid-state drive (SSD) is a memory data storage device that utilizes solid-state memory to store persistent data. Solid-state memory can include, for example, flash-type "non-volatile" memory or synchronous dynamic access memory (SDRAM) "volatile" memory. SSDs are an alternative to conventional hard disk drives that have slower memory data access times due to the mechanical moving parts. The absent of rotating disks and mechanical devices in the SSD greatly improves electro-magnetic-interference (EMI), physical shock resistance, and reliability.

Removing an SSD device from many types of computer systems today requires tools. Furthermore, removing an SSD device from many types of computer systems involves pulling cables from cable sockets. Over time, or through incorrect usage, these cables or sockets become frail and can introduce data transfer errors associated with the SSD in use. Installing an SSD device is not any easier because it involves similar hardships.

Furthermore, a computer data center (also referred to as an Internet data center or an enterprise data center) may contain a myriad of computer systems utilizing various SSDs. The large number of high-capacity SSDs in a data center poses significant problems associated with their removal and installation. The time and skills involved in removing or installing SSDs in a data center, without damage, can become burdensome. Accordingly, it is becoming extremely important to be able to easily, quickly, and efficiently remove and install an SSD device in a computer system.

SUMMARY

A computing device, in accordance with various examples of the present disclosure, provides a solution to the above-mentioned problems using a novel latch assembly to secure the SSD component in place. The computing device includes an electronic component. In some embodiments of the disclosure, the electronic component may include an SSD device. Other electronic components can be implemented herein. The computing device can also include a latch assembly for securing the electronic component. To secure the latch assembly in place, the computing device may also include a attaching element configured to receive a latch assembly.

In one aspect of the present disclosure, the latch assembly includes a latch, a base, and a cover to secure the latch within the base. The latch may include a first structural member. The first structural member may include a first plurality of pins. The latch may also include a second structural member. The second structural member may include a second plurality of pins. The latch may also include at least one linking element that connects the first structural member and the second structural member. In some examples, the latch may include two linking elements connecting the first structural member and the second structural member. In such examples, the two linking elements intersect at a location to enable the latch to deform during the loading of the latch within the base. Finally, the latch may include a first securing element located at the first structural member. In some exemplary embodiments of the disclosure, the latch is made up of flexible material.

In some embodiments of the disclosure, the base may include an attaching element for receiving the latch. The base may also include a first plurality of slots configured to receive the first plurality of pins. In some examples, the first plurality of slots are elongated to enable the first structural member to slide along the slots via the first plurality of pins. The base may also include a second plurality of slots configured to receive the second plurality of pins. In some embodiments of the disclosure, the base may include a plurality of protruding elements from the sidewalls of the base. The base may also include a second securing element that corresponds with the first securing element of the latch.

In some embodiments of the disclosure, the cover is secured to the base at the plurality of protruding elements. In some embodiments of the disclosure, the cover includes a plurality of apertures corresponding with the plurality of protruding elements. In some exemplary embodiments, each protruding element of the base is secured within each aperture of the cover. In some embodiments, the cover secured to the base contacts the latch at the location where the two linking elements connect to lock the latch in place.

Although many of the examples are described herein with reference to enclosing a solid state drive (SSD) device, it should be understood that these are only examples, and the present disclosure is not limited in this regard. Rather, any electronic component installed within a computer data center can be implemented within the disclosed enclosure.

Additional features and advantages of the disclosure will be set forth in the description that follows, and in part, will be obvious from the description, or can be learned by practice of the principles disclosed herein. The features and advantages of the disclosure can be realized and obtained by means of the instruments and combinations particularly pointed out in the appended claims. These and other features of the disclosure will become fully apparent from the following description and appended claims, or can be learned by the practice of the principles set forth herein.

BRIEF DESCRIPTION OF THE DRAWINGS

In order to describe the manner in which the above-recited and other advantages and features of the disclosure can be obtained, a more particular description of the principles briefly described above will be rendered by reference to specific examples illustrated in the appended drawings. These drawings depict only example aspects of the disclosure, and are therefore not to be considered as limiting of its scope The principles are described and explained with additional specificity and detail through the use of the following drawings.

DETAILED DESCRIPTION

Figure 1:
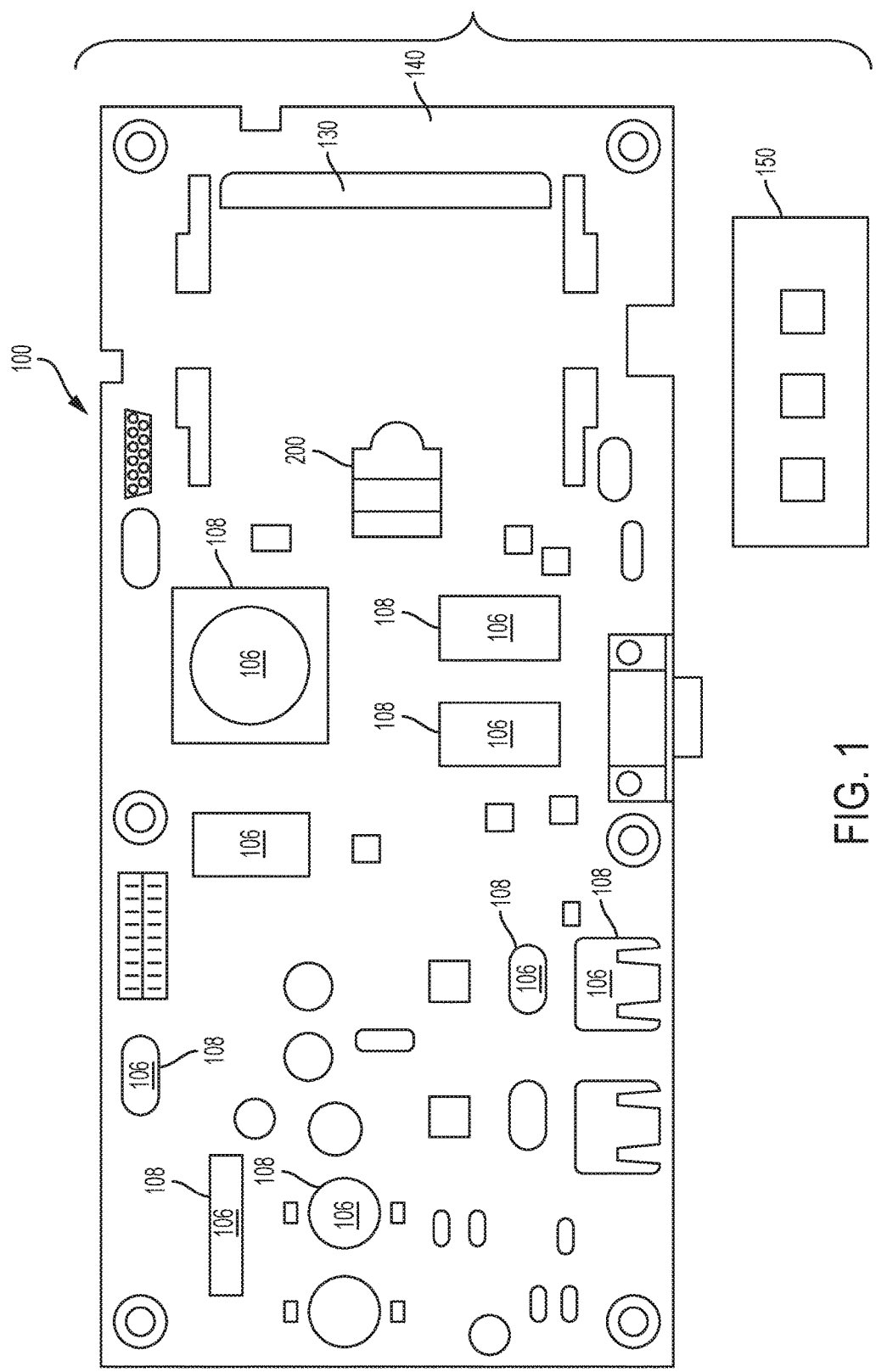
FIG. 1 shows an exemplary embodiment of a printed circuit board assembly (PCBA) 100, in accordance with an implementation of the present disclosure.

The present invention is described with reference to the attached figures, wherein like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As discussed above, there is significant interest in developing means to efficiently and reliably remove and install an SSD device into a computer system. In particular, there is significant interest in developing means that: (1) do not require tools to install an SSD into a computer system; (2) minimize space requirements for the SSD and supporting hardware in the computer system; and (3) reduce or eliminate instances of incorrect installation of the SSD, which can result in damage to the SSD, the computer system, or connectors between them.

In view of the foregoing, the present disclosure contemplates a low profile latching mechanism for removing and installing an SSD device onto a printed circuit board assembly within a computer system. In particular, the present disclosure contemplates a low profile latching mechanism design that allows a technician to easily and reliably install an SSD onto a printed circuit board assembly. Such a design is illustrated in FIGS. 1-6.

FIG. 1 shows an exemplary embodiment of a printed circuit board assembly (PCBA) 100, in accordance with an implementation of the present disclosure. The PCBA 100 can be any size, shape and/or design (e.g., form factor) known to those of skill in the art. The PCBA 100 can include any number and variety of electrical components (e.g., processors, memory, etc.) coupled to either surface of the PCBA 100 (e.g., top and/or bottom). In the exemplary embodiment, the PCBA 100 can have one or more component receiving modules 106 coupled therewith. Each component receiving module 106 is configured to receive a component 108 therein. Furthermore, the PCBA 100 can have a receiving space 140 for an expansion card. In some embodiments, the expansion card can include a M.2 solid state drive (SSD) 150. For the purposes of the present disclosure, the description is directed towards a M.2 SSD. However, it should be apparent that various expansion card configurations may be implemented herein.

Figure 2:
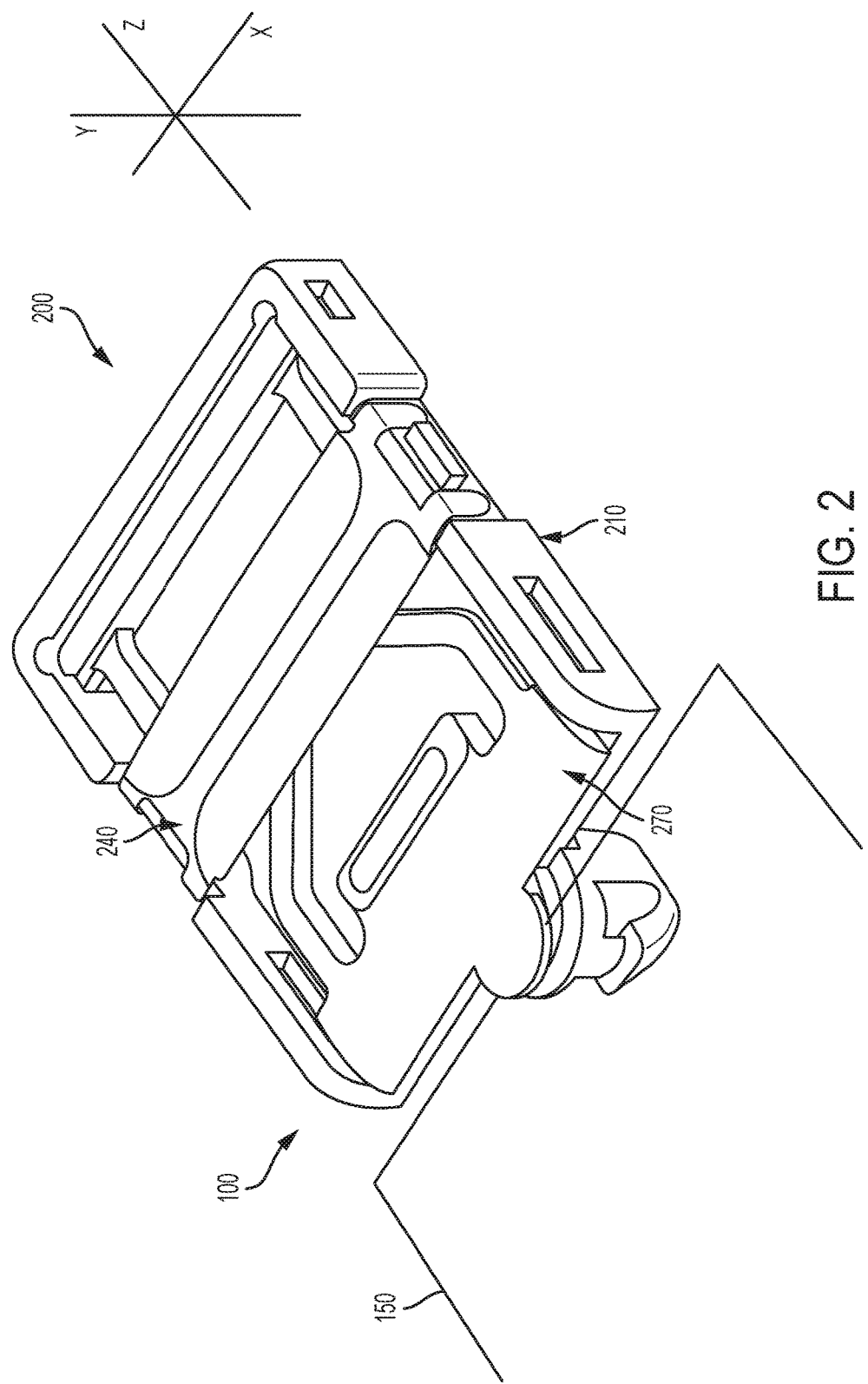
FIG. 2 is a top isometric view of a latch assembly according to an embodiment.

The PCBA 100 can have a latch assembly 200 [in FIG. 2] coupled to assist in coupling and decoupling the SSD 150. In the exemplary embodiment, the PCBA 100 includes a connector 130 for sustaining an electrical connection with the SSD 150. The connector 130 includes pins which, when in contact with pins of the SSD 150, allow for an exchange of electrical signals between the SSD 150 and the electrical components on the PCBA 100. The latch assembly 200 is discussed in greater detail below.

FIG. 2 is a top isometric view of a latch assembly 200 according to an embodiment. As described above, the latch assembly 200 secures the SSD 150 to the PCBA 100. As shown in FIG. 2, the latch assembly 200 includes a base 210, a latch 270, and a cover 240. In an embodiment of the disclosure, the latch assembly 200 is configured to assist in coupling and decoupling the SSD 150 from the PCBA 100. As an initial matter, the base 210 is coupled to the PCBA 100. The SSD 150 is then inserted into the PCBA 100. The latch 270 is coupled to the base 210. At least a small section of the SSD 150 is secured between the latch 270 and the base 210. In some embodiments of the disclosure, the SSD 150 can include a notch (not shown) configured to correspond with the latch 270 and the base 210.

This secures the SSD 150 in place. In securing the SSD 150 to the PCBA 100, the SSD 150 can direct force to the latch assembly 200 in the z-direction. The cover 240 provides structural support to prevent the latch 270 from deforming from this force. As discussed in greater detail below, the latch 270 is secured within the receiving space of the base 210 using pins and slots.

Figure 3:
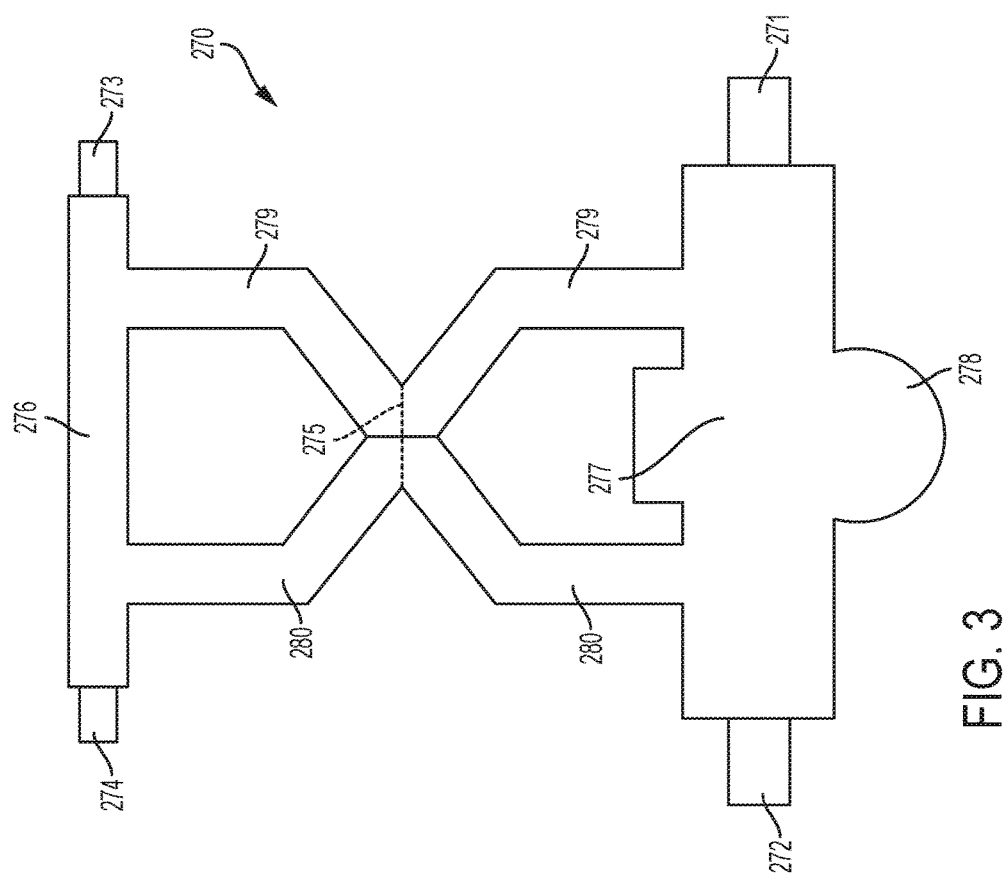
FIG. 3 is a top view of a latch of the latch assembly of FIG. 2, according to an embodiment of the disclosure.

FIG. 3 is a top view of the latch 270 according to an embodiment of the disclosure. As shown in FIG. 3, the latch 270 includes a first structural member 277 and a second structural member 276. The structural members 276 and 277 are interconnected by linking elements 279 and 280. The linking elements 279 and 280 are configured to bend and deform at center line 275. In some embodiments, the linking elements 279 and 280 can overlap to create an intersection. The latch 270 also includes a securing element 278 located at the first structural member 277. In some embodiments, the first structural member 277 can also include pins 272 and 271 located at opposing distal ends. In some embodiments, the second structural member 276 can include pins 274 and 273 located at opposing distal ends. The pins 271, 272, 273, and 274 are configured to secure the latch 270 within the base 210 (shown in FIG. 2).

The latch 270 and its components can be made from a single flexible element, such as plastic. In some embodiments, the linking elements 279 and 280 can be made from a single flexible element, while the first structural member 277 and a second structural member 276, are made from more rigid materials. The latch 270 and its components can be made of any material constructed to allow the latch 270 to bend and conform at centerline 275. This is discussed in greater detail below with respect to FIG. 6. Furthermore, the latch 270 and its components can be made of any material constructed to withstand varying temperatures, and air flow of high velocity (from a plurality of fan modules not shown). The materials mentioned above are only for example, and not intended to limit this disclosure. A person having ordinary knowledge in the art may flexibly select any material in accordance with the disclosure.

Figure 4:
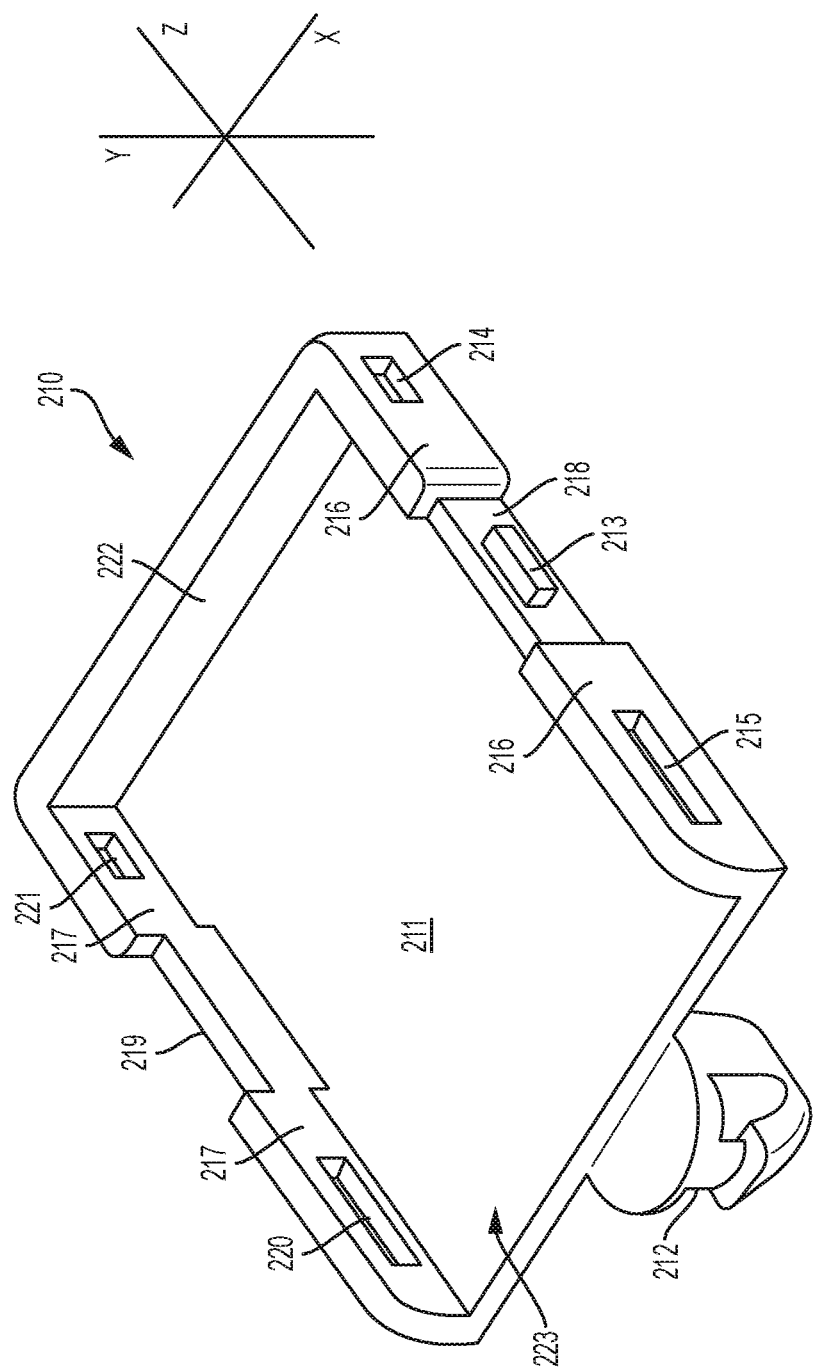
FIG. 4 is a top isometric view of the base of the latch assembly of FIG. 2, according to an embodiment of the disclosure.

FIG. 4 is a top isometric view of the base 210 according to an embodiment of the disclosure. As shown in FIG. 4, the base 210 includes a receiving space 211 for receiving the latch 270 (shown in FIG. 3). The base 210 can also include a front end 223, a rear wall 222, and side walls 216, 217, 218 and 219. In some embodiments of the disclosure, the side wall 216 includes slots 214 and 215. Similarly, in some embodiments of the disclosure, the side wall 217 includes slots 220 and 221. Side wall 218 has a protruding element 213. Similarly, side wall 219 has a protruding element (not shown) extending in the x-direction outward from the base 210. The base 210 can also include a securing element 212 located at the front end 223. The securing element 212 can be configured to secure the base 210 to the PCBA 100 (shown in FIG. 1).

The base 210 is rigid in comparison with the latch 270. In some embodiments, the base 210 and its components can be made of sheet metal using conventional metal fabrication techniques such as bending, forming, and stamping. As a result, the base 210 can be made inexpensively. Alternatively, the base 210 and its components can be made of aluminum alloy, steel alloy, or any combination thereof. The base 210 and its components can be made of any material constructed to withstand varying temperatures, and air flow of high velocity (from a plurality of fan modules not shown). The materials mentioned above are only for example, and not intended to limit this disclosure. A person having ordinary knowledge in the art may flexibly select any material in accordance with the disclosure.

Referring momentarily to both FIGS. 3 and 4, the slots 221 and 214 of walls 217 and 216 are configured to secure the second structural member 276 of the latch 270. For example, the slot 221 within wall 217 is configured to receive the pin 274 of the second structural member 276. Furthermore, the slot 221 within wall 216 is configured to receive the pin 273 of the second structural member 276. Moreover, the slots 215 and 220 of walls 216 and 217 are configured to secure the first structural member 277 of the latch 270. For example, the slot 220 within wall 217 is configured to receive the pin 272 of the first structural member 277. Furthermore, the slot 215 within wall 216 is configured to receive the pin 271 of the first structural member 277. This is discussed in further detail with respect to FIG. 6.

Figure 5:
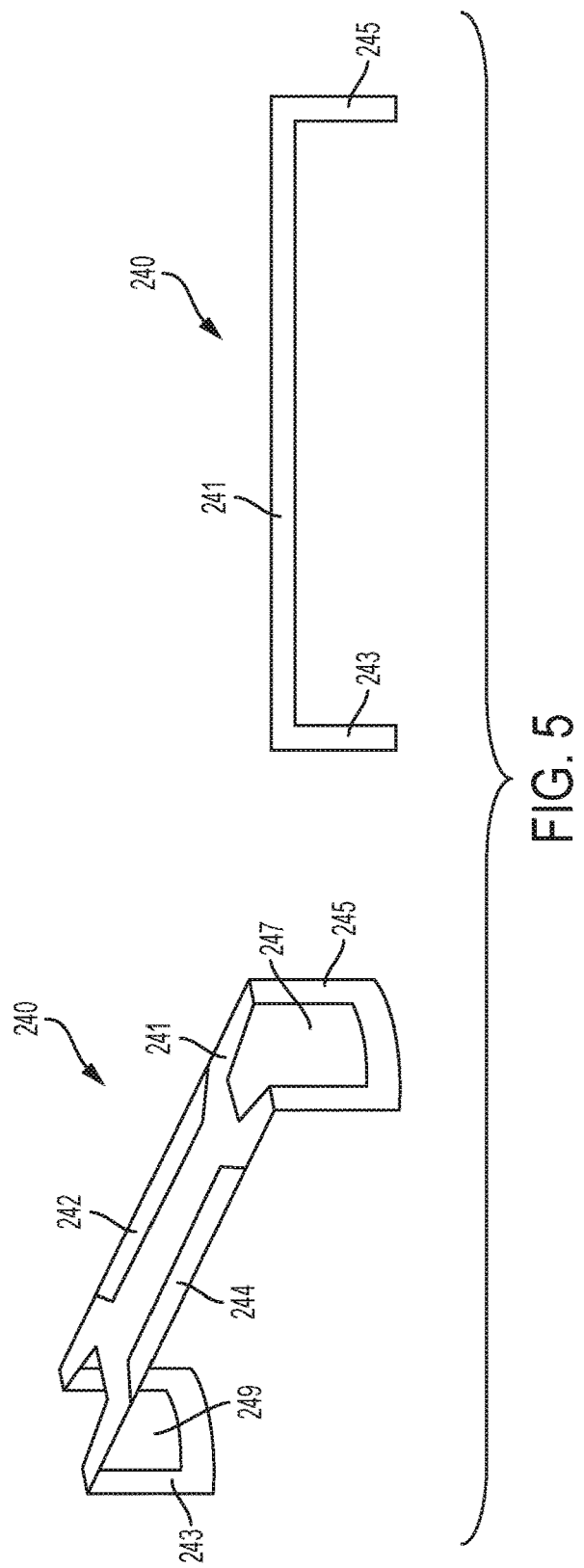
FIG. 5 is a top isometric view of the cover of the latch assembly of FIG. 2, according to an embodiment of the disclosure.

FIG. 5 is a top isometric view of the cover 240 according to an embodiment of the disclosure. As shown in FIG. 5, the cover 240 includes a top surface 241. In some embodiments of the disclosure, the cover 240 can also include distal ends 245 and 243. In some embodiments, the distal end 245 of the cover 240 can include aperture 247. Likewise, the distal end 243 of the cover 240 can include aperture 249. The top surface 241 can include flaps 242 and 244. The cover 240 and its components can be made of sheet metal using conventional metal fabrication techniques such as bending, forming, and stamping. As a result, the cover 240 can be made inexpensively. In some embodiments of the disclosure, the flaps 242 and 244 are a result of forming the cover 240. The flaps 242 and 244 reinforce the strength of the cover 240 to fortify its rigidness. Alternatively, the cover 240 and its components can be made of aluminum alloy, steel alloy, or any combination thereof. It should be realized that the cover 240 and its components can be made of any material constructed to withstand varying temperatures, and air flow of high velocity (from a plurality of fan modules not shown). The materials mentioned above are only for example, and not intended to limit this disclosure. A person having ordinary knowledge in the art may flexibly select any material in accordance with the disclosure.

Figure 6:
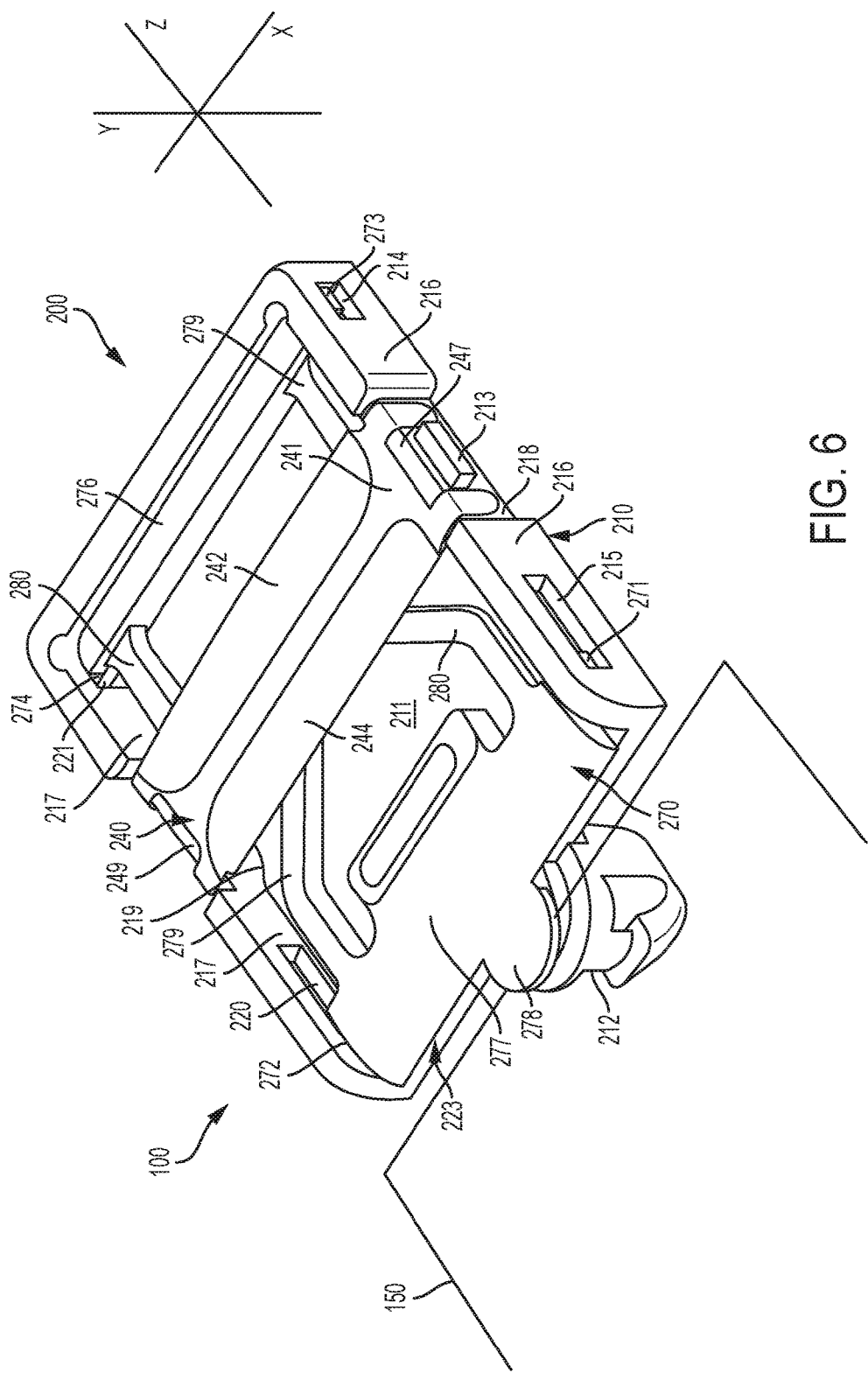
FIG. 6 shows the latch inserted into a receiving space of the base and secured in a locked position by the cover, according to an embodiment of the disclosure.

FIG. 6 shows the latch 270 inserted into a receiving space 211 of the base 210 and secured in a locked position by the cover 240. As an initial matter, the base 210 can be installed within the PCBA 100. The PCBA 100 can contain a receiving element (not shown) that will receive the securing element 212 located at the front end 223 of the base 210. The receiving element can include, for example, a threaded hole, a slot, or other known connection configurations. The SSD 150 can be inserted into the PCBA 100 to lay flush against the front end 223 of the base 210. In this configuration, at least a small section of the SSD 150 is in contact with the securing element 212 of the base 210. The latch 270 can be installed within the base 210 to secure the SSD 150.

When assembling the latch 270 into the base 210, the pins 274 and 273 of the second structural member 276 are inserted within the slots 221 and 214, respectively. By inserting the pins 274 and 273 within the slots 221 and 214, respectively, the second structural member 276 of the latch 270 is secured within the base 210. The pins 272 and 271 of the first structural member 277 are inserted within the slots 220 and 215, respectively. It is noted that the pins 272 and 271 of the first structural member 277 are not elongated like the slots 220 and 215. The slots 220 and 215 are elongated to allow the first structural member 277 to move along the z-axis in the direction towards the second structural member 276. Because the latch 270 is made of a flexible material, the latch 270 is able to compress and bend at centerline 275 (shown in FIG. 3). In alternative embodiments, the first structural member 277 may not include pins 271 and 272. For example, the top surface 241 of the cover 240 can be widened to extend towards the first structural member 277 to secure the latch 270.

Once the SSD 150 is installed, the latch 270 is installed to secure the SSD 150 in place. The SSD 150 is secured between the securing element 278 located at the first structural member 277, and the securing element 212 located at the front end 223 of the base 210. In some embodiments of the disclosure, the SSD 150 can include a notch (not shown) configured to correspond with the securing element 278 and the securing element 212.

During the process of loading the latch 270, the second structural member 276 is installed first, following the first structural member 277. The ability of the latch 270 to compress and bend at centerline 275 (shown in FIG. 3) enables the first structural member 277 to move back in forth in the z-axis. When the latch 270 is bent at centerline 275 (shown in FIG. 3), the SSD 150 is able to be removed or installed. Once the SSD 150 is secured between the securing element 278 and the securing element 212, the cover 240 can be installed to secure the latch 270. The cover 240 has two apertures 247 and 249.

In the locked position, the aperture 247 is configured to secure the protruding element 213 of the side wall 218 of the base 210. Similarly, the aperture 249 is configured to secure the protruding element (not shown) of the side wall 219 extending in the x-direction outward from the base 210. The protruding elements of the base 210 secure the cover 240 to the base 210. Although apertures 247 and 249 are shaped rectangular in FIG. 5, it should be apparent that any shape or configuration aperture can be implemented. Similarly, the protruding elements can be configured to any shape or configuration to correspond with the apertures of the cover 240.

In securing the cover 240 to the base 210, the underside of the cover 240 contacts the centerline 275 (shown in FIG.

3) of the latch 270. Because the cover 240 can be made of bent, formed, or stamped sheet metal, the cover 240 can be a rigid material. Therefore, the cover 240 is unlikely to bend at the force received from the centerline 275 (shown in FIG. 3) of the latch 270. Thus, the cover 240 restricts the latch 270 from deforming or bending at the centerline 275 (shown in FIG. 3).

While various embodiments of the present invention have been described above, it should be understood that they have been presented by way of example only, and not limitation. Numerous changes to the disclosed embodiments can be made in accordance with this disclosure without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to limit the invention. As used herein, the singular forms "a", "an", and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A computing device, comprising:
an electronic component; and
a latch assembly for securing the electronic component, the latch assembly comprising:
a latch comprising a first structural member, a second structural member, two linking elements interconnecting the first structural member and the second structural member, and a first securing element located at the first structural member,
a base comprising a receiving space for receiving the latch, a second securing element, and a plurality of protruding elements;
wherein the first securing element of the first structural member configured to secure the first structural member to the second securing element of the base, and the second securing element corresponding with the first securing element,
a cover secured to the base at the plurality of protruding elements,
wherein the electronic component is secured between the first securing element and the second securing element,
wherein the two linking elements are configured to deform along a central line during assembling of the latch within the base, and the cover secured to the base contacts the two linking elements are configured to deform at a location where the two linking elements deform to lock the latch in place.

2. The computing device of claim 1, wherein the first structural member comprises a first plurality of pins.

3. The computing device of claim 2, wherein the base first comprises a first plurality of slots configured to receive the first plurality of pins, wherein, when the two linking elements deform along the central line, the first plurality of pins slide along the first plurality of slots.

4. The computing device of claim 3, wherein the first plurality of slots are elongated such to enable the first structural member to slide along the slots via the first plurality of pins.

5. The computing device of claim 1, wherein the second structural member comprises a second plurality of pins.

6. The computing device of claim 5, wherein the base comprises a second plurality of slots configured to receive the second plurality of pins.

7. The computing device of claim 1, wherein the cover comprises a plurality of apertures corresponding with the plurality of protruding elements, wherein each protruding element is secured with each aperture of the cover.

8. The computing device of claim 1, wherein the latch comprises a flexible material.

9. The computing device of claim 1, wherein the electronic component comprises a solid state drive.

10. A latch assembly for securing an electronic component within a computing device,
the latch assembly comprising:
a latch comprising a first structural member, a second structural member, two linking elements interconnecting the first structural member and
the second structural member, and a first securing element located at the first structural member,
a base comprising a receiving space for receiving the latch, a second securing element and a plurality of protruding elements;
wherein the first securing element of the first structural member configured to secure the first structural member to the second securing element of the base, and the second securing element corresponding with the first securing element,
a cover secured to the base at the plurality of protruding elements,
wherein the electronic component is secured between the first securing element and the second securing element;
wherein the two linking elements are configured to deform along a central line during assembling of the latch within the base, and the cover secured to the base contacts the two linking elements are configured to deform at a location where the two linking elements deform to lock the latch in place.

11. The latch assembly of claim 10, wherein the first structural member comprises a first plurality of pins and the first connection element comprises a first plurality of slots configured to receive the first plurality of pins.

12. The latch assembly of claim 11, wherein, when the two linking elements deform along the central line, the first plurality of pins slide along the first plurality of slots.

13. The latch assembly of claim 10, wherein the second structural member comprises a second plurality of pins and the base comprises a second plurality of slots configured to receive the second plurality of pins.

14. The latch assembly of claim 10, wherein the cover comprises a plurality of apertures corresponding with the plurality of protruding elements, wherein each protruding element is secured with each aperture of the cover.

15. The latch assembly of claim 10, wherein the latch comprises a flexible material.

16. The latch assembly of claim 10, wherein the electronic component comprises a solid state drive.

* * * * *